United States Patent [19]
Huber et al.

[11] Patent Number: 5,854,812
[45] Date of Patent: Dec. 29, 1998

[54] METHOD OF DIGITAL TRANSMISSION OF MESSAGES USING DYNAMIC-RANGE-LIMITED PRECODING

[75] Inventors: Johannes Huber, Langensendelbach; Robert Fischer, Erlangen, both of Germany

[73] Assignee: ke Kommunikations-Elektronic GmbH & Co., Hanover, Germany

[21] Appl. No.: 592,808

[22] Filed: Jan. 26, 1996

[51] Int. Cl.⁶ ............... H04L 25/49; H03K 7/02
[52] U.S. Cl. .......... 375/296; 375/353; 332/107; 332/115
[58] Field of Search ................ 375/296, 285, 375/353; 332/106, 107, 115

[56] References Cited

U.S. PATENT DOCUMENTS

| 5,260,971 | 11/1993 | Cole | 375/296 |
| 5,291,520 | 3/1994 | Cole | 375/296 |
| 5,396,519 | 3/1995 | Betts et al. | 375/296 |
| 5,559,561 | 9/1996 | Wei | 375/296 |

FOREIGN PATENT DOCUMENTS

| 31 03 641 | 11/1982 | Germany | 375/296 |

*Primary Examiner*—Stephen Chin
*Assistant Examiner*—Jeffrey W. Gluck
*Attorney, Agent, or Firm*—Ware, Fressola, Van Der Sluys & Adolphson LLP

[57] ABSTRACT

A method for digital transmission of messages is indicated, in which each digital transmission symbol in a data stream to be transmitted is represented by one of several different possible signal values. The signal values of the transmission symbols are routed to a predistortion system, which counteracts their distortion in the transmission path, and whose output signal is transmitted through a linked transmission path. The transmitted signal is scanned at the end of the transmission path, it is then processed further and routed to a decoder. The maximum amplitude of the signal in the receiving-end decoder is limited by limiting the number of different possible signal values corresponding to each transmission symbol.

6 Claims, 4 Drawing Sheets

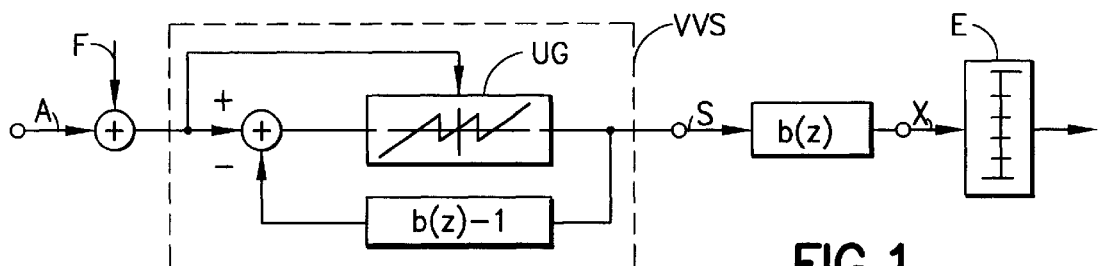
FIG.1
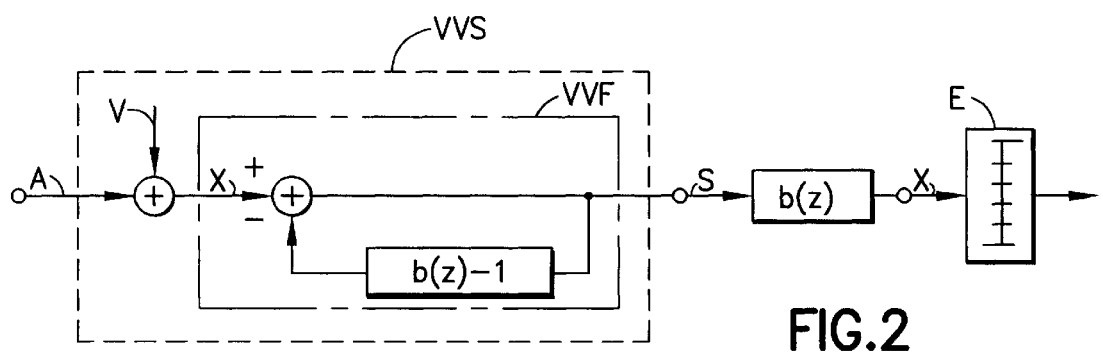
FIG.2
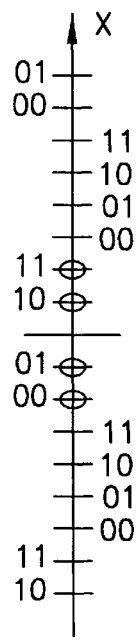 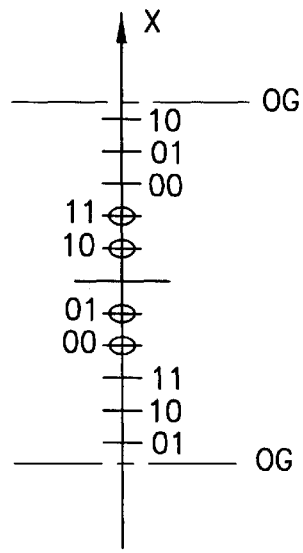 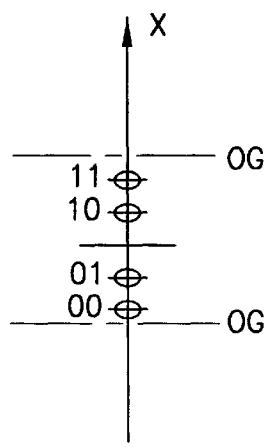
FIG.3a   FIG.3b   FIG.3c

METHOD OF DIGITAL TRANSMISSION OF MESSAGES USING DYNAMIC-RANGE-LIMITED PRECODING

TECHNICAL FIELD

The invention is directed to a method for the digital transmission of messages, and more particularly, to a method of precoding a signal to be transmitted to communicate digital information.

BACKGROUND OF THE INVENTION

The digital transmission of messages is known in the art in which each digital transmission symbol of a data stream to be transmitted is represented by one or another of several different signal values, where the signal values of the transmission symbols are routed to a predistortion system that counteracts their distortion in the transmission path and provides an output signal to a linked transmission path, and where the transmitted signal is scanned at the end of the transmission path and is then processed further as well as routed to a decoder, "Combined Equalization and Coding Using Precoding," by G. David Forney et al, in IEEE Communications Magazine, December 1991, pages 25 to 34.

With such a method, signals can be transmitted via line-conducted or wireless means. Cables with electrical or optical transmission paths are used for the line-conducted transmission. The wireless transmission takes place for example via directional radio or satellite radio. Interference during the transmission is caused for example by thermal noise, cross-talk from other signals and noise from electronic and electro-optical components. However, production tolerances and timing fluctuations can also cause interference.

According to the channel coding theorem of information theory, high reliability in a transmission signal can be achieved during the digital transmission of messages via interference-containing transmission channels, if continuous Gaussian distribution signal values are used to represent the digital transmission symbols, instead of fewer discrete symbol values. Methods for producing transmission signals with this property are called signal-shaping or signal-forming methods. Such a method is described for example in "Trellis Shaping" by G. David Forney, in IEEE Transactions on Information Theory, Vol. 38, No. 2, March 1992, pages 281 to 300. As opposed to evenly distributed (equally likely) signal values, a multistep transmission makes a reduction in the average transmission power possible, with the same reliability of transmission. Such a reduction in the average transmission power has special significance for the digital transmission of messages via media in which interference is essentially caused by cross-talk from similar signals, e.g. in core pairs of multipaired cables. In such cases, a reduction in the transmission power simultaneously causes a reduction in the interference between parallel transmission paths.

The 1991 Forney article describes a method for transmitting digital symbols via transmission channels that cause linear distortions of the signals. Such transmission channels are present for example in cables containing pairs of metal cores. The linear distortions of this method are compensated for by a predistortion of the signals. To that end, a nonlinear predistortion system, the so-called "Tomlinson-Harashima Precoding" (THP), is used in the transmitter. The effect of this nonlinear predistortion system can be represented by a linear predistortion filter and a periodic continuation of the signal constellation. In that case, the different transmission symbols to be transmitted are not mapped into an equal number of discrete amplitude values of the transmission signal—as was done until now—(e.g. 0 and 1 with binary transmission; dibits 00, 01, 10, 11 with quaternary transmission), rather a periodic continuation of these amplitude values takes place. This periodic continuation is produced for example by a nonlinear transfer element with a characteristic sawtooth curve, which is located in the predistortion system. Each period of this sawtooth curve corresponds to a continuation for one period of the signal constellation. Each digital transmission symbol is therefore represented by very many different amplitude values of the transmission signal—hereafter called "signal values".

In this way, the THP also produces a periodic continuation of the signal constellation in the receiver. This strongly increases the dynamic range of the signal at the output of the transmission channel. This mostly drastic increase of the signal dynamic range on the receiving side of severely distorting transmission channels makes further signal processing at the receiving end very difficult, particularly any adaptive fine correction of the distortion, and extracting the clock pulse of the symbol from the signal. In the same way, statistical dependencies in the receiving signal and its nearly Gaussian distribution have a detrimental effect on the run-in behavior of adaptive anti-distortion devices. Both effects are produced by THP on the transmitting side.

SUMMARY OF THE INVENTION

An object of the invention is to reduce the dynamic range of the received signal in a digital communication system compared to the above-described prior art.

The invention achieves this object by limiting the number of different possible signal values for each transmission symbol to be transmitted.

Instead of an infinite periodic continuation of the signal constellation, this method only recognizes signal values whose amplitude does not exceed a preselected upper barrier. This is achieved for example by using a nonlinear transfer element, in the predistortion system, that has a characteristic curve with only a few sawteeth with linear branches for input values of large magnitude. Each sawtooth corresponds to a signal value. The characteristic curve has two to four saw-teeth, for example. Instead of many signal values for each transmission symbol, this method therefore only uses a few in accordance with the upper barrier. In each instance, the signal value whose instantaneous value is the smallest at the output of the linear predistortion filter is selected. This selection is made by the non-linear transfer element. Therefore, this method already considers on the transmitting side the properties of the signal on the receiving side. The signal dynamic range is thereby held to the desired limits in the decoder. Even further processing of the signal and the adaptive fine correction of the distortion, as well as the extraction of the clock pulse from the symbol, are considerably simplified.

Since very large amplitude values in the receiving side signal are avoided, the intersymbol interference is significantly reduced. In this way, a much smaller data and coefficient word length is sufficient to represent the signal in the receiver for further digital processing by means of an analog-digital conversion, for example for adaptive fine correction. This not only makes implementation significantly more cost-effective; it can also be used at much higher data rates. The bandwidth of the phase control loop for obtaining the clock pulse of a symbol can be increased, since more clock pulse jitter can be tolerated. In this way, a better capture-and-lock behavior is achieved.

In contrast to THP, the distribution of the amplitude values on the receiving side deviates severely from the Gaussian distribution because of the amplitude limitation. This characteristic of the method makes possible the use of blind anti-distortion methods for the adaptive fine correction on the receiving side. In addition, statistical dependencies in the sequence of received signal values are reduced, due to the limitation of the dynamic range of the received signal. This favorably affects the run-in behavior of adaptive anti-distortion devices.

The principle of the dynamic range reduction can also be used as described above, when the signal is additionally shaped with the use of shaping-bits. In this way the signal values are not only selected based on the digital transmission symbols to be sent, but also based on freely selectable shaping-bits. Several possible different signal values, which are limited in number, are available for each combination of shaping-bits and digital transmission symbol. The number of possible signal values is again limited by an upper barrier. In this way, the dynamic range of the received signal is limited. For each combination of shaping-bits and digital transmission symbol to be transmitted, the signal value with the smallest amplitude at the output of the predistortion system is selected. In addition, a decoder determines that sequence of shaping-bits for which the average output, over many symbol clock pulses, is minimum at the output of the predistortion system. In this way, the distribution of the transmission signal becomes nearly Gaussian.

If the symbols of the data stream to be transmitted and the shaping-bits are routed directly and separated from each other to a pulse amplitude modulator via different inputs, without a separate scrambler, their mixing and joint scrambling take place through the predistortion system alone. Without a scrambler, descrambling in the receiver and therefore error multiplication are eliminated. The reduction in the transmission power remains intact. The transmission range can therefore be increased.

BRIEF DESCRIPTION OF THE DRAWINGS

The method according to the invention is explained by means of the drawings, wherein:

FIG. 1 is a block diagram performing the method of the invention,

FIG. 2 is an equivalent block diagram for performing the method of the invention, FIG. 3 are diagrams illustrating the limitation of the amplitude of the received signal.

BEST MODE FOR CARRYING OUT THE INVENTION

Figure 4:
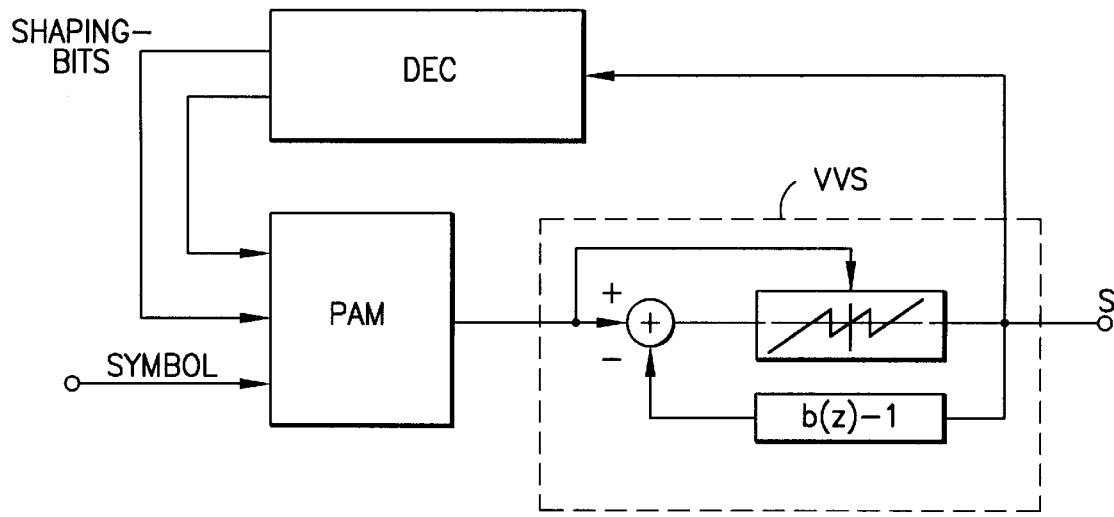
FIGS. 4 and 5 are two different block diagrams according to the invention with shaping.

Referring now to FIG. 1, a predistortion system VVS, according to the present invention is located on the transmitting side of a digital transmission path, which takes into consideration the distortions of the transmission signal S, associated with data signal A corresponding to a particular digital symbol to be transmitted, caused by the transmission path with the time-discrete equivalent transfer function b(z) providing receiver input X, and acts against them. The addition of a shaping signal F is shown in case signal shaping by means of shaping-bits is used. Without the signal shaping, F=0.

Referring now to FIG. 2, the nonlinear behavior of the VVS is described by a correction sequence V, which can also comprise the influence of shaping-bits, and by a linear predistortion filter VVF with the transmission function 1/b (z). The respective digital transmission symbol is identified by a signal value A. The signal values A of the data stream to be transmitted, which are affected by the correction sequence V, are routed to the linear predistortion filter VVF as an effective input sequence X. Since the linear predistortion filter VVF smoothes out the distortions in the transmission path, the signal X is accurately decoded on the receiving side by decoder E. In this arrangement, the transmitter knows the magnitude of the signal dynamic range on the receiving side.

The limitation of the signal dynamic range on the receiving side, or the maximum amplitude of the received signal, is explained in FIGS. 1 to 3.

The VVS uses a nonlinear transfer element UG with a characteristic curve that contains only few saw-teeth, for example two or three, and linear branches for respectively large input values. Each period of the saw-tooth curve corresponds to one periodic continuation of the signal constellation. While Tomlinson-Harashima Precoding (THP) uses an infinite saw-tooth curve in accordance with a modulo reduction of the signal, the present method produces a continuation of the signal constellation for only a few periods, by means of the transmission element with only a few saw-teeth and linear branches. It is preferred that the continuation of the signal constellation be limited to two or three periods. This allows the dynamic range to remain limited on the receiving side. The characteristic curve is selected as a function of the current transmission symbol A. The linear branches of the curve correspond to the use of a limited number of different possible signal values for the same transmission symbol A in each case. In the equivalent block diagram with the linear predistortion filter VVF, as shown in FIG. 2, this limitation of the number of possible signal values means that only a few discrete values are available for combination with the correction values V. The arrangement of FIG. 2 also limits the range of the received signal values to the interval of the signal values X on the transmitting side.

FIG. 3 illustrates the difference between THP with an unlimited number of signal values X for each transmission symbol (FIG. 3*a*), and the dynamic range limited preceding of the invention (FIG. 3*b*) in the case of a quaternary transmission of the dibits 00, 01, 10, 11. The present method uses only a few signal values in accordance with the upper barrier OG. Only the signal value with the smallest instantaneous value at the VVF output is chosen. The selection of the favorable signal value takes place directly, without any further algorithm, through the nonlinear element UG, whose characteristic curve contains only a few sawteeth, with linear branches for large input values. Additional devices for determining the suitable correction value V are only required if it is desired to minimize the signal amplitude at the VVF output.

A small increase in the maximum amplitude on the transmitting side, and in the average transmitting power, can take place because of the limitation of the dynamic range on the receiving side. However, by varying the dynamic range of the possible signal values X of the transmission symbols, a nearly continuous tradeoff can take place between THP with a small signal dynamic range on the transmitting side and a high signal dynamic range on the receiving side, and the usual linear distortion with only one signal value per transmission symbol according to FIG. 3*c*, with a high signal dynamic range on the transmitting side and minimum signal dynamic range on the receiving side. This makes possible a flexible adaptation of the digital transmission method of the present invention to existing requirements.

With the additional use of a signal shaping method, the dynamic range is limited by restricting the range of possible signal values and preceding with nonlinear transmission elements, which have linear branches for correspondingly large amplitude input values. The algorithm for determining the most favorable shaping-bit sequence for shaping the signal is not directly influenced by limiting the dynamic range of the received signal values. Signal shaping only takes place to minimize the average transmitting power and possibly other properties, such as the spectral power density.

Because of the goal of minimizing the average transmitting power, in each step the most favorable signal value for the existing transmission symbol is automatically selected from the limited number of signal values. In this way each selection of the number of signal values, and therefore each possible limitation of the signal dynamic range on the receiving side, ensures that the algorithm for shaping the signal is in a position to find a favorable sequence of shaping-bits.

Figure 5:
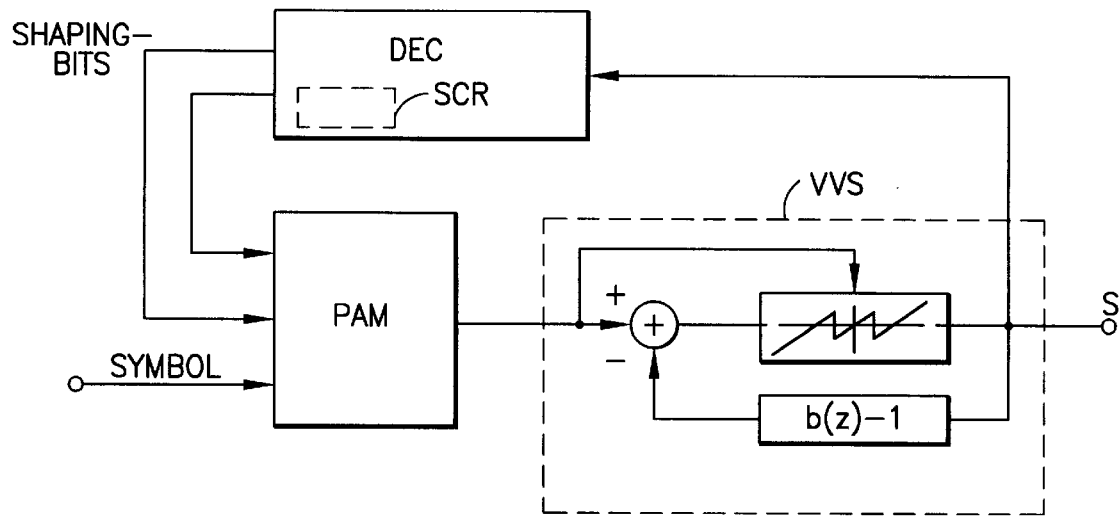

A configuration of the method of the invention including signal shaping can be found in FIGS. 4 and 5.

The digital transmission symbols on the one hand, and the shaping-bits on the other, are routed to a pulse-amplitude-modulator PAM. The shaping-bits are preferably routed to the higher-value inputs, and the transmission symbols to the lower-value inputs, of the PAM. A multistep signal, for example an eight-step signal, is available at the output of the PAM and is routed to the predistortion filter VVS. The PAM output signal could also be a four-step or a sixteen-step signal. The number of steps of the PAM output signal can basically be any number at all.

The transmission signal S is present at the output of the VVS. It is evaluated by a decoder DEC based on its average power, which is to be minimized. The selection of suitable signal values takes place through the nonlinear transfer element of VVS with few saw-teeth, to limit the dynamic range. The characteristic VVS curve is preferably selected as a function of the PAM output, since different numbers of signal values could be available for different combinations of digital transmission symbols and shaping-bits, depending on the limitation of the dynamic range of signal values.

The decoder DEC seeks out a certain sequence of known shaping-bits from the sequences of shaping-bits that are available. This shapes the transmission signal S in the desired manner. The average power of the transmission signal is thereby minimized, while the maximum amplitude of the signal stays limited in the decoder on the receiving side. With these measures it is also possible to influence the spectral characteristics of the received signal. In addition, there is the possibility of achieving the limitation of the dynamic range by means of a corresponding modification of the metrics for signal values outside of a desired range of amplitudes.

Because of the infinite state space of the VVS, this method advantageously uses sequential decoding procedures for trellis codes to shape the signal. For example, the so-called sequential decoder called "M-Algorithm" proved to be suitable.

One transmission step is the providing of an output signal by the PAM. Transmission steps one to D could form a signal shaping step. In that case, a D-dimensional signal shaping takes place without scrambling. It offers the advantage that the mapping of the symbols and shaping-bits forms the signal at the output of the PAM in many ways, so that a more favorable optimum can potentially be found for this arrangement.

Figure 6:
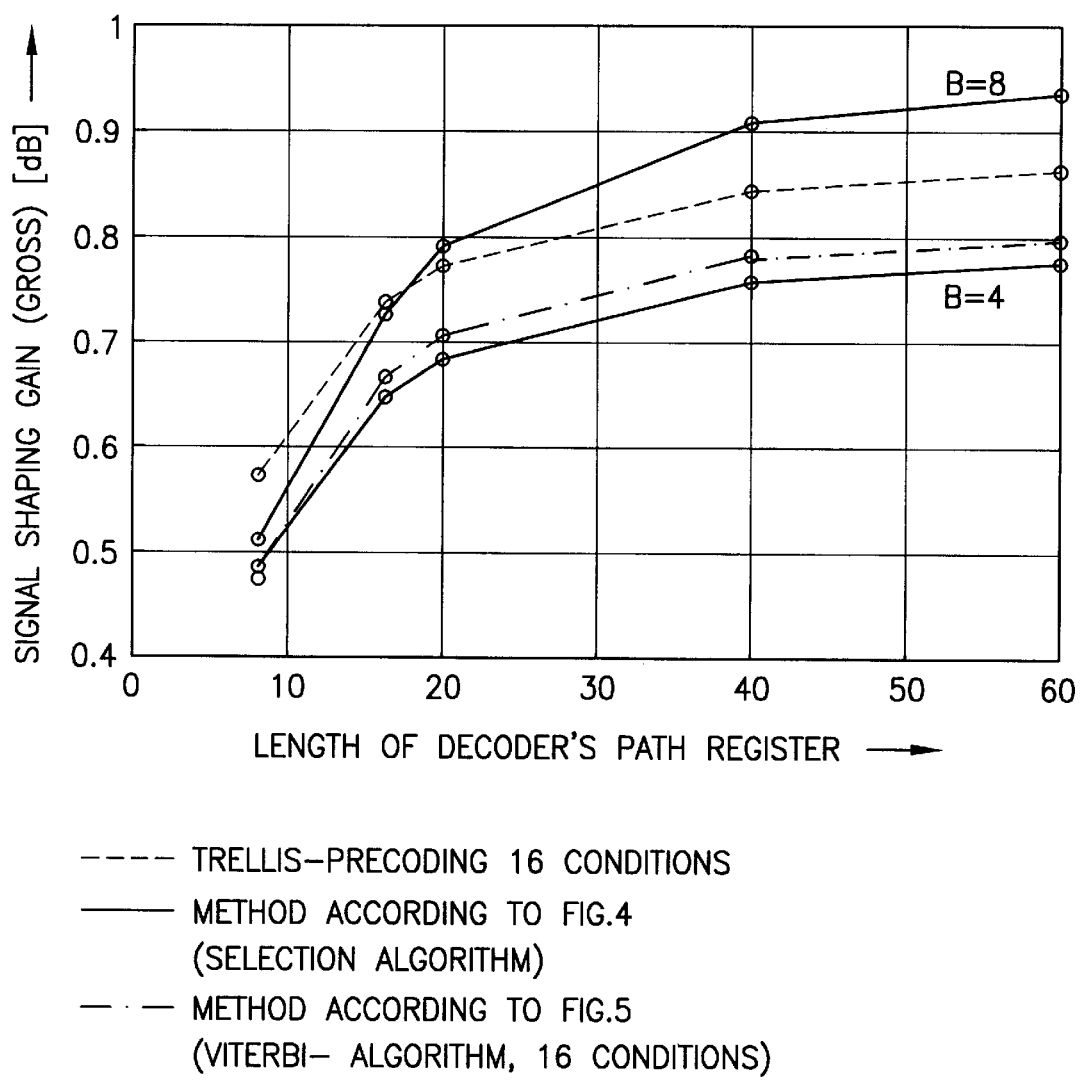
FIG. 6 is a graph of the signal shaping gain versus length of a decoder's path register.

FIG. 6 illustrates (gross) signal shaping gains for a DC-free pulse response, i.e. $b(z=1)=0$, with a length of 12 versus the path register length of the trellis decoding method. Already at B=4 active sequences of shaping-bits in the selection algorithm, a signal shaping gain worthy of mention is attained; the gain is larger than for the method with a scrambler (FIG. 5) with 8 conditions and a Viterbi decoder whose conditions have been reduced to 16, since in this case an error rate of about $10^{-6}$ produces a loss of about 0.25 dB, due to error multiplication.

With high transmission rates, sequential decoding is more difficult than using the Viterbi algorithm, because of the low regularity and ability to parallelize. For that reason, the shaping-bits in FIG. 5 can be scrambled by a so-called imaginary scrambler SCR, i.e. one based only on the decoding algorithm, which belongs to the decoder DEC configured here as a trellis decoder.

Figure 7:
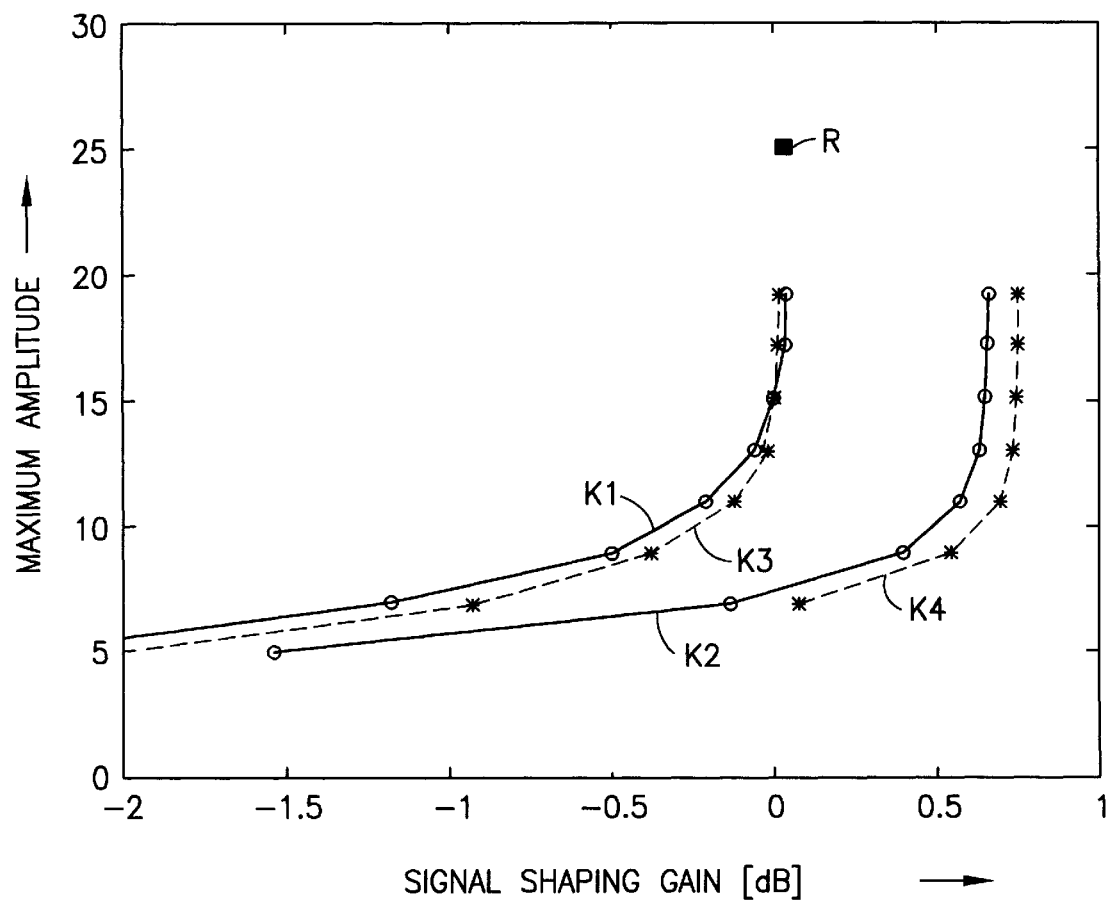
FIG. 7 is a graph of the maximum amplitude of the received signal versus the signal shaping gain.

FIG. 7 illustrates the maximum amplitude of the signal in the decoder E on the receiving side versus the signal shaping gain. Here, 0 dB is the reference point and corresponds to the transmitting power of the THP. For the latter, the maximum amplitude in the decoder E on the receiving side, which corresponds to the drawn reference point R, is 25. Positive dB values correspond to a gain, while negative dB values signify an increase in the average transmitting power. Thus, characteristic curves are of interest for as small a maximum amplitude as possible in the decoder E on the receiving side, and as large a signal shaping gain as possible, i.e., as far to the right as possible in FIG. 7.

The continuous curves K1 and K2 with circles show the exchange (trade-off) between signal shaping gain and dynamic range with a DC-affected time-discrete pulse form with a length of 11 symbols. The broken curves K3 and K4 with crosses represent the result of a DC-free time-discrete pulse form with a length of 12 symbols. The curves K1 and K3 are the result of using the method with only dynamic range limitation. Curves K2 and K4 refer to dynamic range limitation and, in addition, signal shaping. Pulse forms that typically occur with digital transmission via symmetrical cables were selected. Quaternary symbols were transmitted, using with the symbols ±1 and ±3.

If the amplitude range for the signal values of the transmission symbols is used in the described form with THP, a loss must be accepted because of the increase in the signal dynamic range at the VVS output, or in other words an increase in transmitting power. FIG. 7 makes clear that a decisive decrease in the maximum signal amplitude on the receiving side leads to a very small loss due to increased transmitting power. As already mentioned earlier, the method of limiting the dynamic range also makes possible a nearly continuous exchange between the signal dynamic range on the receiving side and transmitting power.

With additional signal shaping of the data stream without scrambling, according to curves K3 and K4, an even more favorable exchange is achieved between signal dynamic range on the receiving side and transmitting power. In spite of the maximum amplitude limitation on the received signal, in this case the result is clearly a power gain. The algorithm for determining a favorable sequence of shaping-bits is realized in this case with an imaginary scrambler and a Viterbi algorithm for 16 conditions and 16 path register lengths.

What is claimed is:

1. A method for the digital transmission of messages along a transmission path, wherein each digital symbol in a data stream to be transmitted corresponds to a transmission symbol from a signal constellation and is represented by one or another of several different signal values, the method using a predistortion system to counteract distortion in the transmission path, the predistortion system providing a transmitted signal that is scanned at the end of the transmission path as a received signal and is then processed further and routed to a decoder, characterized in that the maximum amplitude of the received signal in the decoder on the receiving side is limited by limiting the number of possible signal values representing each transmission symbol to be transmitted, by use of a finite extension of the signal constellation.

2. A method as claimed in claim 1, characterized in that predistortion system (VVS) includes a nonlinear transfer element (UG) whose characteristic curve contains only a few saw-teeth preceded and followed by linear branches for correspondingly large input values.

3. A method as claimed in claim 2, characterized in that the digital symbols together with shaping-bits are routed to a pulse-amplitude-modulator (PAM), in which the signal to be transmitted is subjected to signal shaping during digital/analog conversion, the PAM for providing a shaped analog output of transmission symbols to the predistortion system.

4. A method as claimed in claim 3, characterized in that the digital symbols and the shaping-bits are routed directly and separately to the pulse-amplitude-modulator (PAM) via different inputs.

5. A method as claimed in claim 4, characterized in that the shaping-bits are routed to higher-value inputs and the digital symbols to lower-value inputs of the pulse-amplitude-modulator (PAM).

6. A method as claimed in claim 1, characterized in that the digital symbols together with shaping-bits are routed to a pulse-amplitude-modulator (PAM), in which the signal to be transmitted is subjected to signal shaping during digital/analog conversion, the PAM for providing a shaped analog output of transmission symbols to the predistortion system.

* * * * *

UNITED STATES PATENT AND TRADEMARK OFFICE
CERTIFICATE OF CORRECTION

PATENT NO : 5,854,812
DATED : December 29, 1998
INVENTOR(S) : Huber et al.

It is certified that error appears in the above-identified patent and that said Letters Patent is hereby corrected as shown below:

At column 4, line 45, change "preceding" to --precoding--.

At column 5, line 7, change "preceding" to --precoding--.

Signed and Sealed this

Sixth Day of April, 1999

Q. TODD DICKINSON

Attest:

Attesting Officer

Acting Commissioner of Patents and Trademarks